United States Patent
Stogner

(10) Patent No.: US 6,564,041 B1
(45) Date of Patent: May 13, 2003

(54) SYSTEM AND METHOD PROVIDING IMPROVED FM CARRIER SQUELCH SYSTEM

(75) Inventor: Darrell J. Stogner, Plantation, FL (US)

(73) Assignee: Motorola, Inc., Schaumburg, IL (US)

( * ) Notice: Subject to any disclaimer, the term of this patent is extended or adjusted under 35 U.S.C. 154(b) by 481 days.

(21) Appl. No.: 09/654,741

(22) Filed: Sep. 1, 2000

(51) Int. Cl.$^7$ ................................................. H04B 1/10
(52) U.S. Cl. ..................... 455/218; 455/212; 455/226.2
(58) Field of Search ................................. 455/212, 218, 455/219, 220, 221, 222, 223, 224, 226.1, 226.2

(56) References Cited

U.S. PATENT DOCUMENTS

| | | | | |
|---|---|---|---|---|
| 4,057,761 A | * | 11/1977 | Harbert et al. | 328/154 |
| 4,107,613 A | * | 8/1978 | Queen et al. | 325/348 |
| 4,852,086 A | * | 7/1989 | Eastmond et al. | 370/69.1 |

* cited by examiner

Primary Examiner—Edward F. Urban
Assistant Examiner—Thuan T. Nguyen

(57) ABSTRACT

An improved squelch system (10) is provided in accordance with the present invention. The system includes a high-deviation subsystem (20) to detect a carrier with modulation, and a low-deviation subsystem (30) to detect the carrier with minimal modulation. If either the high-deviation system (20) or the low-deviation system (30) indicate a signal of sufficient strength, an output for the squelch system is set to un-mute, otherwise the output (70) is set to mute.

5 Claims, 1 Drawing Sheet

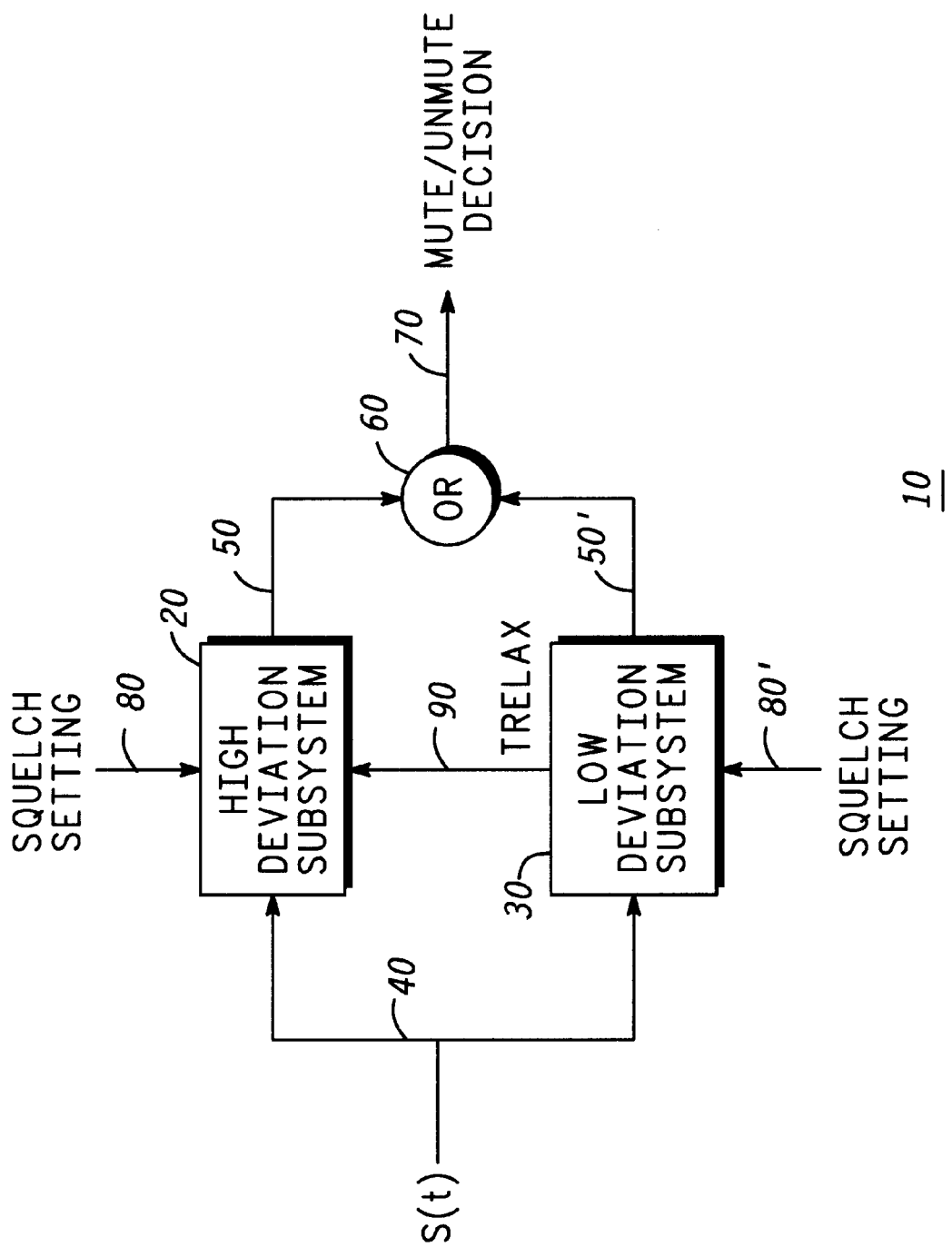

SYSTEM AND METHOD PROVIDING IMPROVED FM CARRIER SQUELCH SYSTEM

TECHNICAL FIELD

The present invention relates generally to Frequency Modulated (FM) systems, and in particular to a system and method providing an improved squelch system for filtering weak signals within an FM system.

BACKGROUND

A primary function for an FM carrier squelch system is to provide for filtering out weak signals, wherein the determination of whether a signal is weak or not generally depends on the Radio Frequency (RF) level of a received carrier with respect to noise power. In order to provide users the ability to filter out poor signals, it is generally necessary determine the signal-to-noise ratio of the received signal.

A received FM modulated signal generally takes the form of:

$$y(t) = A_c \cos[w_c t + \theta_c(t)]$$

$$\theta_c(t) = k_f \int m(t) \partial t$$

wherein, $A_c$ is the amplitude of the carrier, $w_c$ is the carrier frequency, $k_f$ is the frequency deviation factor and $m(t)$ is the message signal modulated onto the carrier. This signal is mixed down into in-phase and quadrature phase components for demodulation. An FM discriminator output may be given by:

$$x(t) = \frac{\partial}{\partial t}\theta_c(t) = \frac{\partial}{\partial t}\left[\tan^{-1}\left(\frac{Q}{I}\right)\right] = \frac{\partial}{\partial t}\left[\tan^{-1}\left(\frac{A_c \sin\theta_c(t) + N_q}{A_c \cos\theta_c(t) + N_i}\right)\right]$$

wherein I and Q are an in-phase and quadrature phase channel and $N_i$ and $N_q$ are the associated independent noise sources. Thus, an FM discriminator output (and an input to a squelch system) is a function not only of the carrier strength and noise environment, but also of the message signal and frequency deviation factor.

In February 1993, The Telecommunications Industry Association published TIA/EIA-603. This document includes a set of standards for Land Mobile FM or PM communications equipment, measurement and performance. Two tests, in particular, relate to squelch: Audio Squelch Sensitivity and Squelch Blocking. Both tests refer to a signal-to-noise ratio called SINAD, which is given by:

$$SINAD(dB) = 20 \cdot \log_{10}\left(\frac{Signal + Noise + Distortion}{Noise + Distortion}\right)$$

The audio squelch sensitivity of a receiver is a minimum signal level from a standard input signal source which opens the receiver squelch. The standard input signal is a 1 kHz frequency sinusoid at 60% of the maximum system deviation. The squelch setting should be set to a position that requires the smallest input signal to produce an un-muted audio output while the RF power is slowly increased until the radio un-mutes. The SINAD that corresponds to this RF level is called the threshold squelch sensitivity. The squelch setting should then be set to the position that requires the largest input signal to produce an un-muted audio output wherein the RF power is slowly increased until the radio un-mutes. The SINAD that corresponds to this RF level is called the tight squelch sensitivity.

Squelch blocking refers to the tendency of a receiver squelch circuit to close in the presence of modulation of the input signal. A user-controlled squelch setting should thus be adjusted to the position that requires the largest input signal to produce an un-muted audio output. For example, an input signal 12 dB above the measured tight squelch sensitivity may be applied. The deviation is increased to the rated system deviation and the modulation frequency is varied slowly from 300 Hz to 3 kHz. The receiver remains un-muted for the duration of the test.

It is noted that the EIA/TIA specifications may ignore a fundamental difficulty in a squelch system, however. When the audio sensitivity test standardizes the input to a sinusoid of frequency 1 kHz and at a deviation of 60% system maximum, for example, the standard does not fully consider that x(t) is dependent upon the message signal. The squelch blocking test is a bit more flexible in that a modulated signal is varied during the test, however, a more useful test would utilize a spectrally rich signal such as speech. Thus, while EIA/TIA standards are a good starting point, they are by no means complete.

Other squelch systems address the dependence of x(t) on the message signal within a single system. Most analog radios have a much wider spectrum and view out-of-band energy as a measure of the noise power. Conventional algorithms, for example, may compare the out-of-band energy with a reference level computed by a curve fitting polynomial. The curve fitting polynomial may characterize the noise power as a function of modulation in order that the algorithm may compensate for signals modulated onto the carrier. Unfortunately, these algorithms are both computationally intensive and may fail the squelch blocking test, described above. Consequently, there is an unsolved need for an improved squelch system and methodology providing higher system performance and improved test standards conformance.

BRIEF DESCRIPTION OF THE DRAWINGS

The features of the present invention, which are believed to be novel, are set forth with particularly in the appended claims. The invention, together with further objects and advantages thereof, may best be understood by reference to the following description, taken in conjunction with the accompanying drawings, in the several figures of which like reference numerals identify like elements, and in which:

FIG. 1 is a schematic block diagram of a squelch system in accordance with an aspect of the present invention.

DETAILED DESCRIPTION OF THE INVENTION

While the specification concludes with claims defining the features of the invention that are regarded as novel, it is believed that the invention will be better understood from a consideration of the following description in conjunction with the drawing figures, in which like reference numerals are carried forward.

The present invention relates to a system and methodology providing an improved performance FM squelch system. Squelch performance is improved by utilizing a dual subsystem design optimized for various aspects of an FM carrier system. A high-deviation subsystem is employed to detect FM carriers with modulation and to discriminate between a wanted carrier and noise. The high-deviation subsystem is configured such that the signal being modulated onto the carrier has a suitably high deviation and employs an autocorrelation function to detect for the presence of noise. The autocorrelation function is optimized for suitable lag values wherein desired frequencies, such as within the speech bandwidth, are not rejected as with conventional systems.

The low-deviation subsystem is configured to operate on minimal and/or silent carrier signals. This system detects signal levels above a predetermined threshold of deviation, which may be caused by noise power overwhelming a weak carrier, for example. If either subsystem determines a signal of sufficient strength, an un-mute flag is set wherein the signal may be forwarded for further FM signal processing without being subjected to squelch reduction, otherwise the input signal is subjected to reduction wherein the signal may be muted from the output. Feedback is also provided between the two systems for added robustness.

Referring to FIG. 1, a system 10 illustrates an aspect of the present invention relating to improved squelch performance. The system 10 includes a high-deviation subsystem 20 and a low-deviation subsystem 30 for providing improved squelch performance over conventional systems. High-deviation refers to a modulated FM carrier signal, wherein low-deviation refers to a silent carrier without substantial modulation. Thus, the present invention provides squelch reduction via the high-deviation subsystem 20 for FM carriers having poor and/or weak modulating signals, wherein the low-deviation subsystem 30 provides squelch reduction for silent carriers having substantially no modulation, yet, are affected by a high degree (e.g., above a predetermined threshold) of noise.

A modulated carrier input signal 40 (e.g., speech signal), for example, may be input to the high and low deviation system 20, 30 respectively, wherein the high-deviation subsystem 20 detects for carriers having a modulation signal below a predetermined threshold, and the low-deviation subsystem 30 detects for silent carriers (e.g., without substantial modulation) having associated noise above a predetermined threshold. An output 50 is provided by the high-deviation subsystem 20 and an output 50' is provided by the low-deviation subsystem 30. If either output is active, (e.g., flag set to a 1) an OR function block 60 asserts an un-mute output signal 70 to an FM audio system (not shown). If the un-mute signal is asserted by the OR function block 60, squelch reduction is not applied to the speech signal 40. If both outputs are inactive however, (e.g., flags associated with outputs 50, 50' set to 0), a silent carrier signal has been detected with a high degree of noise via the high-deviation subsystem 20 and low-deviation subsystem 30, respectively. Thus, the un-mute output 70 is not asserted and squelch reduction is thereby applied to the input signal 40.

The system 10 also includes a set of squelch setting inputs 80 and 80'. These inputs enable a user to adjust the predetermined thresholds described above in order to select a desired squelch setting for either the high-deviation subsystem 20 and low-deviation subsystem 30. A T-Relax feedback signal 90 may also be provided to enable the low-deviation subsystem 30 to relax (e.g., lower) the threshold levels associated with the high-deviation subsystem 20 wherein an intermediate amount of modulation strength is detected.

The high-deviation subsystem 30 will now be described in more detail. Correlation refers to an expected value of the product of two signals. If two signals are defined as samples of the same signal at different time instants, then, this expected value may depend upon how rapidly the time functions may change. This indicates that correlation is related not only to a time shift, but also to how rapidly time samples may change. In other words, this may represent the manner in which an energy content of a signal may be distributed with respect to frequency.

A discrete-time autocorrelation function may be employed to measure how correlated a signal is within itself. An equation for the autocorrelation function may be given by following:

$$R_{xx}(k) = \sum_{k=0}^{N-1} x(n) \cdot x(n-k)$$ Equation 1:

As can be observed from Equation 1, a sum is increased when x(n) and x(n−k) share the same sign and decreased if they have a different sign. In the case of white gaussian noise, the probability of a sample being positive is the same as the probability of a sample being negative (assuming minimal DC offset). Therefore for a non-zero k, the probability of increasing the sum is equal to the probability of decreasing the sum and thus, the result should approach zero as the number of samples approaches infinity. For a k of zero, the samples will have the same sign and the sum will therefore have a large positive value. Thus, the autocorrelation of white gaussian noise is approximately an impulse function.

Speech however, is known to be a highly correlated signal and generally does not produce an impulse function. A peak impulse occurs at for a value of k=0, wherein a periodicity of the autocorrelation function is related to the periodicity of the input speech signal. Vowels and other voiced speech segment are characterized by resonant frequencies of the vocal tract tube, called formants. These formant frequencies vary from phoneme to phoneme. The autocorrelation function varies widely over a frequency range and therefore varies for the speech signal as vocal utterances change.

As mentioned above, $R_{xx}(k)$ is dependent on the frequency of the speech input. Two strong signals of identical energy may have very different values for $R_{xx}(k)$ if they have different spectral components, however. This may imply that as the signal becomes more and more uncorrelated, $R_{xx}(0)$ becomes much larger that $R_{xx}(k)$. If the difference between $R_{xx}(0)$ and $R_{xx}(k)$ is greater than a pre-determined threshold, it may be determined that the signal is made up of noise. Since phonemes have widely varying energies, a suitable threshold comparison is as follows:

$$\frac{R_{xx}(0) - |R_{xx}(k)|}{R_{xx}(0)} = 1 - \frac{|R_{xx}(k)|}{R_{xx}(0)} \geq T$$ Equation 2:

wherein T is the threshold for a particular squelch setting.

The smaller T is, the less noise is tolerated. The present invention may enable a plurality of squelch settings. For example, a setting of 1 is a setting that threshold squelch may be measured at, and indicates that users will accept poor signals. This setting would have the largest value of T. A squelch setting of 15, for example is a setting that tight squelch is measured at, and indicates that a user desires to accept strong signals. This setting would have the smallest value of T, for example. An alternate Equation 3 may be employed in place of Equation 2 and may yield higher computation performance if applied in an algorithm, for example, and is shown below:

$$R_{xx}(0) - |R_{xx}(k)| \geq T \cdot R_{xx}(0)$$ Equation 3:

It has been discovered that a minimum set of values for k provides suitable squelch performance without rejecting desired speech frequencies such that:

$$\text{Max}\{R_{xx}(k_0)|,|R_{xx}(k_1)|,|R_{xx}(k_2)|, \ldots, |R_{xx}(k_{N-1})|\}$$ Equation 4:

Values of k=1,3,4,5,6 provides a suitable minimum set, thus:

$$1 - \frac{\text{Max}\{|R_{xx}(1)|, |R_{xx}(3)|, |R_{xx}(4)|, |R_{xx}(5)|, |R_{xx}(6)|\}}{R_{xx}(0)} \geq T$$ Equation 5:

The low-deviation subsystem 30 will now be described in more detail below. Autocorrelation, described above, performs adequately when message signals modulated onto the carrier have a sufficient amount of deviation. When there is no signal modulated onto the carrier, the situation is somewhat different. The equation for a demodulated output x(n) is given by:

$$x(t) = \frac{\partial}{\partial t}\theta_c(t) = \frac{\partial}{\partial t}\left[\tan^{-1}\left(\frac{Q}{I}\right)\right] = \frac{\partial}{\partial t}\left[\tan^{-1}\left(\frac{A_c\sin\theta_c(t) + N_q}{A_c\cos\theta_c(t) + N_i}\right)\right]$$ Equation 6:

Message information is thus contained in $\theta_{cc}(t)$ and no longer varies. Therefore, when the carrier amplitude is much larger than the noise amplitude:

$$A_c \gg N_{q,i}$$ Equation 7:

The argument to the arctangent in Equation 6 is not changing and therefore the arctangent is not changing. Since the derivative of a constant is 0, x(t) approaches 0 as the signal-to-noise ratio (SNR) approaches infinity. As the RF level of the carrier drops, with resulting SNR reductions, the noise power begins to cause variations within I and Q modulation channels, for example. The derivative of a random process yields a random result with the maximum level being the maximum rate of change. The more rapidly the I and Q channels vary, the larger x(t) becomes. With no carrier at all, the deviation may vary up to a system maximum. For substantially silent carrier conditions, a method to determine the SNR of the received signal is to integrate signal energy outside a given deviation. Mathematically, the equation is as follows:

$$\Phi_{xx} = \sum_{n=0}^{N-1} (|x(n)| - \beta)^2 = 0 \quad \text{else} \quad \forall \ |x(n)| > \beta$$ Equation 8:

For example, β may be set to 4 kHz that defines a predetermined lower and upper threshold condition. Samples having magnitudes exceeding these thresholds may be included in the sum in Equation 7. Thus, noise exceeding the predetermined threshold, defined by the squelch setting input 80' for example, would be subject to squelch reduction in accordance with the invention.

While certain aspects of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A squelch system, comprising:
   a high-deviation subsystem to detect a carrier with modulation; and
   a low-deviation subsystem to detect the carrier with minimal modulation; wherein if either the high deviation system or the low deviation system indicate a signal of sufficient strength, an output for the squelch system is set to un-mute, otherwise the output is set to mute.

2. The squelch system of claim 1, wherein the high-deviation subsystem determines a signal of sufficient strength by executing the function:

$$\frac{R_{xx}(0) - |R_{xx}(k)|}{R_{xx}(0)} = 1 - \frac{|R_{xx}(k)|}{R_{xx}(0)} \geq T.$$

3. The system of claim 2, wherein k is an integer value, having at least one value of 1, 3, 4, 5, and 6.

4. The squelch system of claim 1, wherein the low-deviation subsystem determines a signal of sufficient strength by executing the function:

$$\Phi_{xx} = \sum_{n=0}^{N-1} (|x(n)| - \beta)^2 = 0 \quad \text{else} \quad \forall \ |x(n)| > \beta.$$

5. The squelch system of claim 1 further comprising a feedback signal to enable the low-deviation subsystem to relax the threshold levels of the high-deviation subsystem.

* * * * *